United States Patent [19]
Keller et al.

[11] Patent Number: 5,387,312
[45] Date of Patent: Feb. 7, 1995

[54] HIGH SELECTIVE NITRIDE ETCH

[75] Inventors: David J. Keller, Boise; Debra K. Gould, Nampa, both of Id.

[73] Assignee: Micron Semiconductor, Inc., Boise, Id.

[21] Appl. No.: 89,205

[22] Filed: Jul. 9, 1993

[51] Int. Cl.$^6$ ............................................. H01L 21/00
[52] U.S. Cl. .................................. 156/662; 156/643; 156/646; 156/657; 156/653
[58] Field of Search ............... 156/643, 646, 662, 657, 156/651, 653

[56]  References Cited
U.S. PATENT DOCUMENTS

| | | | |
|---|---|---|---|
| 4,568,410 | 2/1986 | Thornquist | 156/643 |
| 4,793,897 | 12/1988 | Dunfield et al. | 156/643 |

FOREIGN PATENT DOCUMENTS

| | | |
|---|---|---|
| 0283306 | 9/1988 | European Pat. Off. |
| 0414372 | 2/1991 | European Pat. Off. |
| 235134 | 4/1986 | Germany |
| 54-125979 | 9/1979 | Japan |
| 60-246636 | 12/1985 | Japan |

OTHER PUBLICATIONS

"Selective Etching of Silicon Nitride Using Remote Plasmas of CF$_4$ and SF$_6$"; J. Vac. Sci., A, vol. 7, No. 3, pt. 1; Loewenstein; May 1989; abstract only.

"Thin Film Investigations and Sputter Etching"; Emmoth et al.; Annual Report-Res Inst Phys. (Swed); 1979; abstract only.

"Highly Selective Etching of Silicon Nitride (Si$_3$N$_4$) to Silicon Dioxide Employing Fluorine and Chlorine Atoms Generated By Microwave Discharge"; J. Electrochem. Soc.; vol. 136, No. 7; Jul. 1989; pp. 2032-2034; Suto et al.

Primary Examiner—R. Bruce Breneman
Assistant Examiner—George Goudreau
Attorney, Agent, or Firm—Lia M. Pappas

[57] ABSTRACT

A cleaner, selective etch process wherein NF$_3$ ions and nitrogen ions are employed to bombard a patterned nitride layer disposed superjacent an oxide layer, thereby creating substantially vertical sidewalls, especially useful when etching submicron features.

20 Claims, 1 Drawing Sheet

HIGH SELECTIVE NITRIDE ETCH

NOTICE OF RELATED APPLICATION

The present application is related to U.S. patent application entitled, "Method for Enhancing Etch Uniformity Useful in Etching Submicron Nitride Features," having the Ser. No. 08/029262, filed on Mar. 10, 1993, by the inventors of the present application, and assigned to Micron Semiconductor, Inc.

FIELD OF THE INVENTION

This invention relates to semiconductor manufacturing, and more particularly to a cleaner process for selectively etching a layer of nitride over a layer of oxide.

BACKGROUND OF THE INVENTION

As semiconductor device dimensions get smaller, and device density increases, it becomes more and more difficult to build an efficient and reliable isolation process to separate active devices. One drawback with the LOCal Oxidation of Silicon (LOCOS) is the decreasing pad thickness which makes etch steps more difficult.

The process of the present invention provides a new nitride etch that is suitable for etching submicron features, and that stops on a thin pad oxide without substantially pitting the underlying silicon. These characteristics make the process of the present invention well suited for use in the conventional LOCOS process.

The process of the present invention, provides no significant center to edge "loading" effect. Center to edge "loading" effect refers to a characteristic non-uniformity in etching wherein the center of a wafer etches at a slower rate than the edges, thereby resulting in a wafer which is thicker in the center than at the edges. If there is very little center to edge "loading" effect, then the etch uniformity across the wafer will be very good.

Previous technologies consist of the following etch chemistries: $SF_6/HeO_2$, $CF_4/CHF_3$, $NF_3/HBr$, $NF_3HCl$, $NF_3/Cl_2$, $NF_3/O_2$. These processes tend to have problems associated with them. The processes containing $Cl_2$ in the overetch tend to exhibit trenching in the tight areas.

The processes containing carbon, sulfur, or bromine tend to be dirty. Dirty processes cause wafer and chamber contamination. Dirty processes also cause build up of contamination in the tight areas of the wafer, thereby causing "micro-loading."

"Micro-loading" refers to uneven etching of the wafer. If there is less "micro-loading", then the "open" and "tight" areas will etch at substantially the same rate. "Open" refers to the less confined spaces of the semiconductor device, such as the periphery of the device or the scribe lines, which tend to etch at a faster rate than "tight" areas. "Tight" refers to the more constricted areas of the semiconductor device, such as the area within the array and the runners between transistors.

These and other known processes suffer from either poor "loading" effects, poor uniformity, or poor nitride to oxide selectivity, which will make these processes inadequate for etching submicron nitride features.

The process using $NF_3/O_2$ also has drawbacks. One of the problems relates to the effectiveness of $NF_3/O_2$ as an etchant of photoresist. Hence, the process will suffer from excessive photoresist loss, and a large disparity between the critical dimensions measured: 1) during an inspection after development, i.e., after the photolithography patterning step, and 2) during an inspection after clean, i.e., after the wafer has been etched. The disparity in the dimensions results due to resist erosion.

The process of the present invention is clean, in addition to having high nitride to oxide selectivity, good resist selectivity, good uniformity, and substantially no "micro-loading."

SUMMARY OF THE INVENTION

The primary object of the present invention is to overcome the problems of the prior art processes.

A novel etch chemistry comprising $NF_3$ and $N_2$ has been developed that is clean and highly selective. The process of the present invention etches nitride 4–5 times faster than pad oxide. In addition, this process is well suited to etch submicron nitride features because there is nothing in the process that will build up in the tight areas (such as, for example, carbon, sulfur, boron, or bromine) to cause loading.

One advantage of the process of the present invention is desirable feature of being able to fine tune the critical dimensions of the wafer features. In other words, the $NF_3:N_2$ ratio can be adjusted to result in a zero value for "after development inspect" (ADI) to "after clean inspect" (ACI). The critical dimensions of the features on the wafer after the photolithography step, are substantially the same as after those same features have been etched into the wafer.

The process of the present invention employs the use of etchants which are non-depositing in nature to combat "loading" effects in etch processes requiring a significant amount selectivity between different materials.

The main etch uses a $Cl_2$, $NF_3$ chemistry. The majority of the gas flow is $Cl_2$. The reaction is very physical in nature, involving ion bombardment. Then, the process of the present invention employs a highly selective nitride-to-pad oxide second step. The second step uses a $NF_3:N_2$ chemistry. The fluorine from the $NF_3$ gives a very fast nitride etch rate, while the nitrogen gives a very slow pad oxide etch rate, as well as maintaining a "clean" process.

One advantage is that this process shows very little loading effect (i.e., the tight areas etch at the same relative rate as the open areas). The etch is very uniform (the etch uniformity is 3–5%). Therefore, less overetching is necessary to clear the remaining nitride. The etch is very selective to the underlying pad oxide (selectivity to of nitride:oxide is about 5:1). All these attributes enable the etching of very small submicron geometries, while stopping on thin pad oxides. As previously stated, this process is very effective for submicron features of less than 0.5 $\mu$m.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
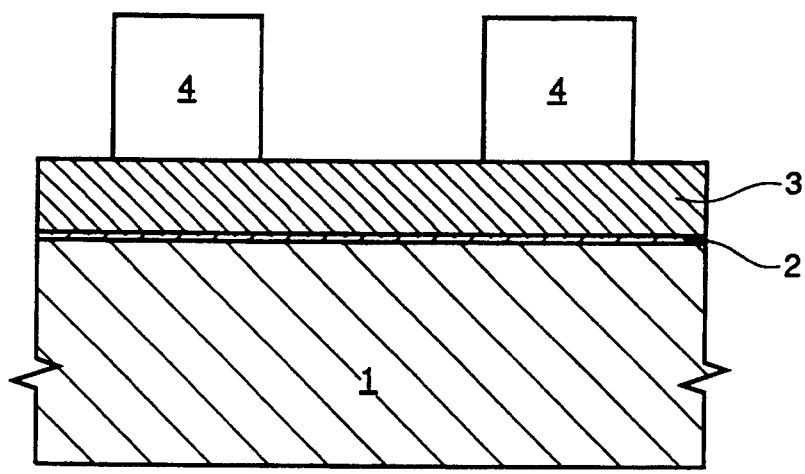
FIG. 1 is a schematic cross section of a patterned semiconductor substrate.

Referring to FIG. 1, a patterned substrate commonly used in a conventional LOCOS process is illustrated. It will serve as a representative example. However, one having ordinary skill in the art, upon being apprised of the process of the present invention, would know how to apply it to other process steps involving nitride etching, for example in etching an oxide/nitride/oxide (ONO) stack.

In FIG. 1, a substrate 1 is illustrated on which has been disposed a thin pad oxide 2. The substrate 1 is preferably a semiconductor material, of which silicon is preferred. The pad oxide 2 can be either grown or deposited to a depth of approximately 250 Å, the preferred method being that of growing the oxide in the appropriate ambient. Superjacent the pad oxide 2 is a layer 3 having a depth of approximately 2400 Å.

Layer 3 is preferably a nitride layer. In this particular etch, layer 3 acts as a protective or resistant area to cover the future active areas during the subsequent field oxidation process. The nitride layer 3 is deposited by any method known in the art.

A photoresist layer 4 is deposited and patterned on top of the nitride layer 3. The photoresist layer 4 may define features having submicron geometries in the approximate range of 0.5 μm. Of course, larger geometries can also be patterned.

Figure 2:
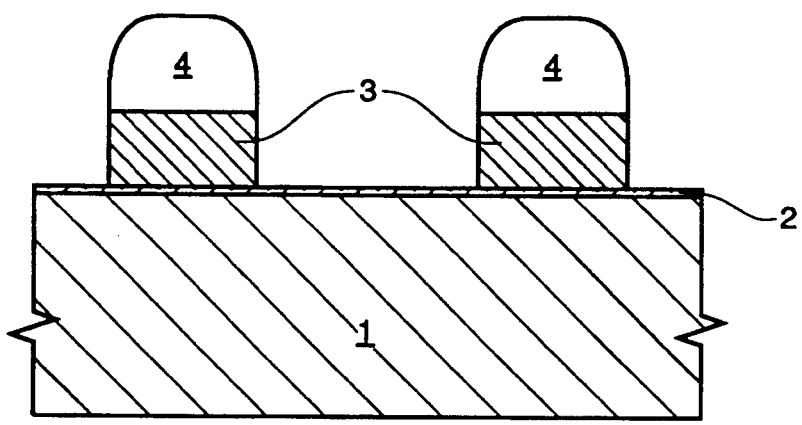
FIG. 2 is a schematic cross section of the semiconductor substrate of FIG. 1, subsequent to etching according to the process of the present invention.

The structure of FIG. 1 is then etched according to the process of the present invention to result in the structure depicted in FIG. 2. The etch of the present invention has a basis in the physical nature of the reaction, more specifically in ion bombardment. Hence, the process of the present invention is most effective when performed in a chamber in which ions can be accelerated. Such chambers are known in the art, and include, but are not limited to, reactive ion etchers, preferably magnetically enhanced reactive ion etchers, and high density source etchers.

The present invention involves the physical impact of the ions which enables the reaction proceed, as compared to a simple chemical reaction. While the invention anticipates chemical reaction, it uses the physical impact of the etchant chemical ions to enhance the uniformity of the etch process.

The process of the present invention comprises two etch steps, preferably performed in situ, i.e., in the same reaction chamber. The first step, or main etch comprises flowing a halogen, such as, for example, chlorine ($Cl_2$) at a rate of approximately 45 sccm, and a fluorine containing compound, preferably nitrogen fluoride ($NF_3$) at a rate of approximately 5 sccm for a time in the approximate range of 30-60 seconds. The preferred pressure is in the approximate range of 100 mtorr and the preferred power is approximately 500 watts. Of course, one having ordinary skill in the art will realize that the above values will vary depending on the make and model of the etcher used in the process. The etch processes were carried out in an Applied 5000 Magnetically Enhanced Reactive Ion Etcher, sold by Applied Materials Corporation of Santa Clara, Calif.

An inert gas, preferably argon (Ar) can also be added to the etch plasma. The inert gas tends to further enhance the uniformity of the etch process. Argon is preferred because of its weight and commercial availability, but the other inert gases can also be used.

The preferred embodiment employs a $Cl_2$, $NF_3$ chemistry in the main etch step. The majority of the gas flow is $Cl_2$, (chlorine tends to be more physical than fluorine) from which ions are accelerated toward the substrate 1. When $Cl_2$ reacts with the silicon in a $Si_3N_4$ molecule, it forms a volatile $SiCl_x$. The reaction is very physical in nature because of the low volatility of $SiCl_x$, as compared to $SiF_y$. High power is needed to generate high ion energy.

It should also be noted that because of the high $Cl_2$ ion energy, the $Cl_2$ step must be stopped before the nitride layer 3 is clear. If the nitride layer 3 is allowed to clear, the high ion energy will cause the $Cl_2$ to "punch through," i.e., penetrate, the oxide layer 2. Hence, the $Cl_2$ step is stopped while there is still a fair amount of the nitride layer 3 left on the wafer 1.

One drawback of such a physical $Cl_2$ etch, is that it has very poor selectivity to the underlying pad oxide 2. To substantially alleviate this problem, the process of the present invention employs a highly selective nitride-to-pad oxide second step.

The second part of the process of the present invention, also known as the "overetch" step, comprises flowing a fluorine containing compound, preferably $NF_3$ at a rate of approximately 10 sccm, along with $N_2$, at a rate of approximately 10 sccm. The overetch step lasts about 35 seconds. The preferred pressure is in the approximate range of 350 mtorr, and the preferred power is in the approximate range of 150 watts, at 75 gauss, with 20° C. backside cooling temperature. Once again, these parameters will vary with the make and model of etcher employed in the process.

The preferred embodiment has a second step which uses a $NF_3$, $N_2$ chemistry. The fluorine from the $NF_3$ gives a very fast nitride 3 etch rate, while the nitrogen gives a very slow pad oxide 2 etch rate, producing a very clean process. Nitrogen is used as an additive, and is believed to have a passivation function.

The process of the present invention results in a substantially anisotropic etch, i.e., the walls of the etched nitride features 3 are substantially normal (i.e., perpendicular) to the substrate surface 1. There is essentially no undercutting apparent in the nitride features 3. Thus, submicron features can be etched with considerable reliability. Although the photoresist pattern 4 may exhibit some faceting, this does not have any notable impact on the resulting nitride features 3.

Figure 3:
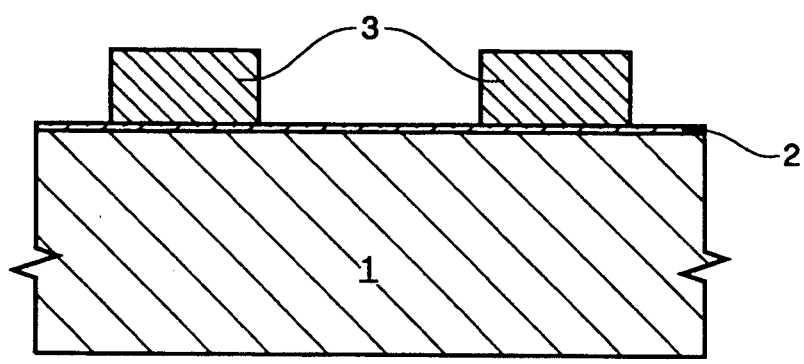
FIG. 3 is a schematic cross section of the semiconductor substrate of FIG. 2, after the photoresist has been stripped.

FIG. 3 illustrates the structure of FIG. 2 after the photoresist 4 has been "stripped," i.e. removed. At this point, in a LOCOS process, for example, the substrate 1 can be oxidized to form the field oxide regions.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the process of the present invention is applicable in other circumstances involving the etch of a nitride layer, when the nitride layer is disposed superjacent an oxide layer, as in an ONO (oxide/nitride/oxide) stack. Further, the process of the present invention is not limited to nitride etches, but is also applicable to other etches requiring selectivity and uniformity.

What is claimed is:

1. An etch process for improving etch uniformity, comprising the following steps of:

bombarding a substrate with an ionized halogen-containing compound, said substrate having a silicon oxide layer and a silicon nitride layer and a patterned mask disposed thereon, said layered substrate is bombarded with $NF_3$ ions in combination with said ionized halogen-containing compound; and thereafter, bombarding said substrate with a nitrogen plasma, said layered substrate is bombarded with $NF_3$ ions in combination with said nitrogen plasma, said halogen containing compound and said nitrogen plasma removing unmasked portions of said layer, thereby creating substantially straight sidewalls in said layer.

2. The process according to claim 1, wherein said layered substrate is ion bombarded in situ.

3. The process according to claim 1, wherein said nitrogen ions, said $NF_3$ ions, and said halogen-containing compound leave essentially no contaminants.

4. The process according to claim 1, wherein said ions are generated in a reactive ion etcher.

5. The process according to claim 1, wherein said pattern defines features, said features having a size of approximately 1.0 $\mu$m or less.

6. The process according to claim 1, wherein said ionized halogen-containing compound is chlorine.

7. The process according to claim 1, wherein an inert gas is added to said ionized halogen-containing compound and said $NF_3$, said inert gas being argon.

8. An etch process having a substantial physical component comprising the following steps of:

exposing a semiconductor substrate to a plasma comprising ionized $Cl_2$, said substrate having at least one layer of nitride disposed thereon, said $Cl_2$ ions etching sidewalls in said nitride layer, said sidewalls being substantially normal to said substrate; and thereafter, exposing said semiconductor substrate to ionized nitrogen in a plasma.

9. The process of claim 8, wherein said substrate is exposed to ionized $NF_3$ in combination with said ionized $Cl_2$.

10. The process of claim 9, wherein said substrate is exposed to ionized $NF_3$ in combination with said ionized nitrogen.

11. The process of claim 10, wherein said nitride layer is disposed on an oxide layer, said nitride layer being patterned with a photoresist layer, said nitrogen enhancing selectivity to said oxide layer.

12. The process of claim 11, wherein said ions are generated in at least one of a reactive ion etcher, a magnetically enhanced reactive ion etcher, and a high density source reactor.

13. A method of etching submicron features, said method comprising the following steps of:

layering a semiconductor substrate with at least one layer of oxide and at least one layer of nitride;

exposing said layered substrate to a first atmosphere, said first atmosphere comprising halogen ions; and exposing said layered substrate to a second atmosphere, said second atmosphere comprising ionized nitrogen.

14. The process of claim 10, wherein said nitride layer is disposed superjacent to an oxide layer, said $NF_3$ ions and said nitrogen ions producing selectivity to said oxide layer.

15. The process of claim 13, wherein said halogen ions comprise chlorine.

16. The method according to claim 13, wherein said first atmosphere and said second atmosphere further comprise fluorine ions, said fluorine ions being generated from $NF_3$.

17. The method according to claim 16, wherein said ions are generated in a reactive ion etcher.

18. The method according to claim 17, wherein an inert gas is added to said first atmosphere, thereby enhancing etch uniformity of said layered substrate.

19. The method according to claim 18, wherein said submircon features have geometries in the approximate range of 1.0 $\mu$m or less.

20. The method according to claim 17, wherein said at least one oxide layer and said at least one nitride layer form part of an oxide/nitride/oxide stack.

* * * * *